United States Patent [19]

Schneider

[11] Patent Number: 5,021,659
[45] Date of Patent: Jun. 4, 1991

[54] BROADBAND SUPERCONDUCTING DETECTOR USING MICROSPHERE SUBSTRATES

[75] Inventor: Richard T. Schneider, Alachua, Fla.

[73] Assignee: Progress Technology Corp., St. Petersburg, Fla.

[21] Appl. No.: 384,484

[22] Filed: Jul. 25, 1989

Related U.S. Application Data

[63] Continuation-in-part of Ser. No. 137,131, Dec. 23, 1987, Pat. No. 4,894,542.

[51] Int. Cl.$^5$ .................... H01L 39/00; G01J 5/00
[52] U.S. Cl. .................... 250/336.2; 505/848; 505/849
[58] Field of Search .................... 250/336.2; 505/848, 505/849

[56] References Cited

U.S. PATENT DOCUMENTS 4,894,542 1/1990 Schneider .................... 250/336.2

Primary Examiner—Constantine Hannaher
Attorney, Agent, or Firm—Cushman, Darby & Cushman

[57] ABSTRACT

A broadband photon detector capable of detecting a steady state flux of incident radiation operates using a superconducting material is biased at the temperature where the material changes from a superconducting to a non-superconducting state. Photons which strike said material cause a temperature rise and a measurable increase in resistivity of the material that continues until the radiation ceases. The superconducting material for detecting the incident radiation is formed as a strip on microspheres that act as a substrate to make as small a heat sink as possible.

16 Claims, 3 Drawing Sheets

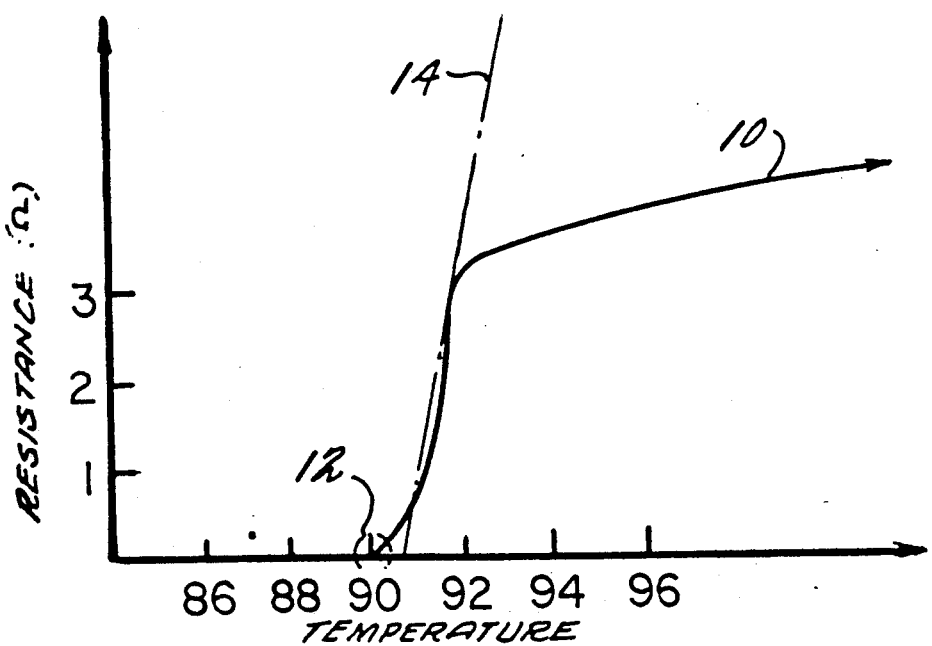
FIG. 1
FIG. 2A
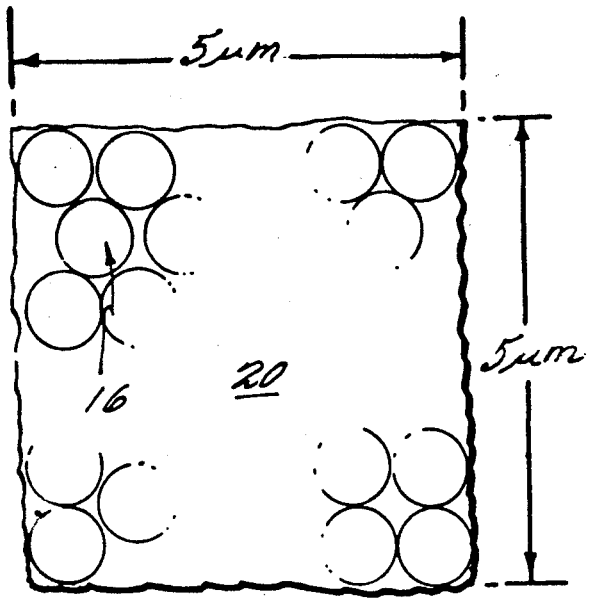
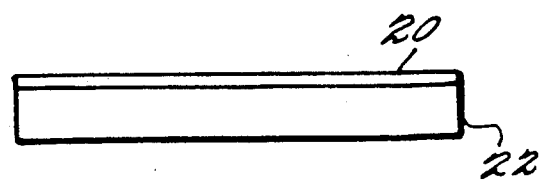
FIG. 2B

BROADBAND SUPERCONDUCTING DETECTOR USING MICROSPHERE SUBSTRATES

This application is a continuation-in-part of U.S. application Ser. No. 07/137,131 filed on Dec. 23, 1987 U.S. Pat. No. 4,898,542.

BACKGROUND OF THE INVENTION

1. Field of the Invention

This invention relates to a broadband superconducting detector which detects incident photons.

2. Background and Prior Art

Pyroelectric detectors detect presence of photons over a broad band of the spectrum with a crystal having an electric dipole moment which varies as a function of the temperature of the crystal. When light is absorbed by the crystal, the temperature of the crystal is raised and the electric dipole moment varies. By detecting the variation, the incidence of photons can be detected.

However, the sensitivity of pyroelectric detectors is low since a large variation in temperature in necessary to cause a measurable change in the crystal's electric dipole moment.

SUMMARY OF THE INVENTION

In the present invention much more sensitive broadband detection of photons can be obtained by using a superconducting material which is temperature biased, preferably at the point at which the superconducting material changes from a superconducting to a non-superconducting state. When a superconducting material is biased in this way, a very small increase in the temperature of the superconductor will cause a measurable increase in the resistivity of the superconducting material. By measuring the change in resistivity of the material when photons strike the material, the incidence of photons can be detected.

Use of the superconducting material in this manner to detect photons greatly increases the sensitivity at which photon detection is possible.

Furthermore, the steady state detection of photons is possible using a superconducting detector material deposited on an appropriate substrate. By keeping the substrate as small as possible and then biasing the detector at an equilibrium temperature, incident radiation will cause an increase in the temperature of the detecting material. This increased temperature will exist until the incident radiation is no longer present. In the preferred embodiment, microspheres are used as a substrate on which the superconducting detector material is coated. The use of microspheres such as these reduces their effect as a heat sink.

BRIEF DESCRIPTION OF THE DRAWINGS

These and other advantages of the present invention may be appreciated from studying the following detailed description of the preferred embodiment together with the drawings in which:

FIG. 1 is a graph showing the relationship of temperature and resistance of a typical superconducting material at and above the transition temperature range where the superconducting material changes from a superconducting state to a non-superconducting state;

FIG. 2(a) illustrates an enlarged top view of a superconducting material used as a detector;

FIG. 2(b) is an enlarged side view of the superconducting material used as a detector mounted on a substrate;

DETAILED DESCRIPTION OF THE PREFERRED EMBODIMENT

Figure 3:
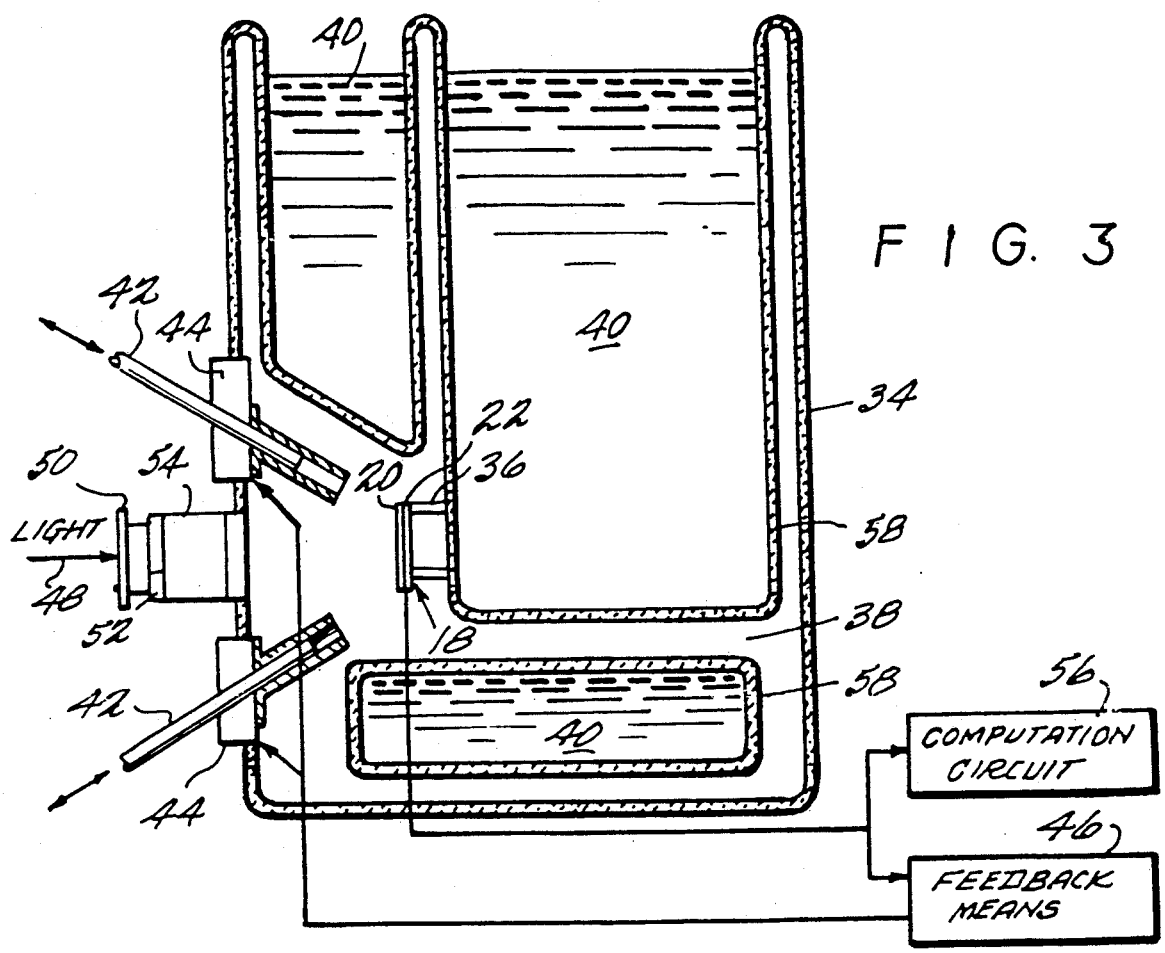
FIG. 3 is a side view of an apparatus using the superconducting material in a device which detects photons.

FIG. 1 illustrates the relationship between temperature and resistance for the transition range of the superconducting material $YBa_2Cu_3O_7$. Other superconducting materials such as $La_2CuO_4$, $Sr_2CuO_4$, $Nb_3Ge$, among others can be used. The April 1987 issue of *Physics Today* shows on page 23 a chart of other superconducting materials which could be used. Even this chart is only illustrative. The 1987 special issue of *Advanced Ceramic Materials*, Vol. 2, No. 3B shows temperature-resistivity charts for these and other superconducting materials at pages 435, 363, 489, 501 and 503. Initial processing of these materials is described at pages 273–281. These publications are hereby incorporated by reference.

A temperature-resistance relationship very similar to the relationship illustrated in FIG. 1 exists for all superconducting materials. Therefore, the term superconducting material will herein after be referred to rather than the elemental structure of the superconducting material being used.

Plot 10 in FIG. 1 illustrates that at a certain temperature, increasing the temperature further will cause a very substantial increase in resistance. The point at which increasing the temperature will cause resistance in the superconducting material is shown as working point 12 in FIG. 1. Biasing the superconductor material substantially at working point 12 enables the detection of incident photons.

The type and structure of the material used of course influences the sensitivity of the detector. The slope of segment 14 in FIG. 1, which extends through the transition range, can be varied by changing the grain size of the superconducting material. In general, the smaller the grain size of the superconducting material, the steeper the slope. Also, varying the composition of the superconducting material will change the sensitivity of the detector.

FIG. 2(a) illustrates a superconducting detector 20 which is made up of individual grains 16. In the preferred embodiment, each grain 16 is no larger than 1,000 angstrom units. A superconducting detector 20 which has individual grains 16 less than 1000 angstrom units in size can be obtained by pulverizing the superconducting material. After the material has been pulverized, the superconducting material is fired for two hours in an oven which reaches a temperature of 1000° K. Bringing the superconducting material to this temperature allows the superconducting material to be used as a detector until the temperature of the superconducting detector 20 reaches the temperature at which it was fired. Because the superconducting detector 20 will be used at a much lower temperature than 1000° K. when detecting photons, superconductor detector 20 is expected to have a relatively long life.

FIG. 2(b) illustrates an elevational view of a plurality of individual grains 16 after they have been fired and mounted on a substrate 22 of either sapphire or quartz.

The superconducting material on the substrate is then polished to a thickness of between 100–1000 angstrom units. Polishing the material down to a thickness of only 100–1000 angstrom units also increases the sensitivity of the device because the grains near the surface receive almost all of incident radiation and therefore more individual grains will be used for actually detecting photons. The polished material and substrate can then be cut into individual detector elements 20, preferably 5 μm by 5 μm, by etching or laser trimming.

Figure 5:
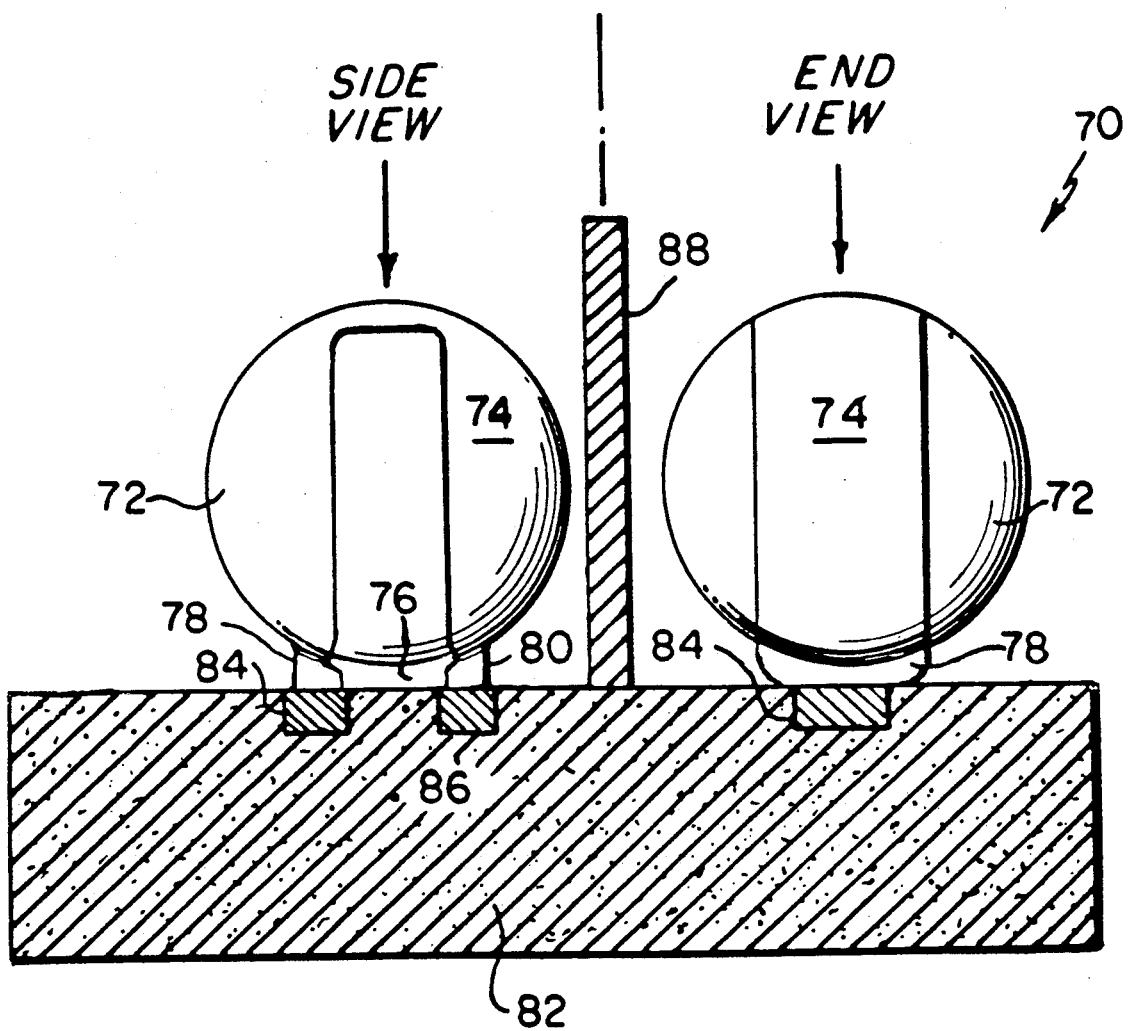
FIG. 5 is a side view of an embodiment of a superconducting detector using microspheres.

If the thickness of substrate 22 is kept sufficiently thin, on the order of about 1–2 wavelengths of the radiation to be detected, the resulting detector elements 20 can be used to detect a steady state flow of incident photons. However, the detector described with reference to FIG. 5 is capable of even more efficient detection of steady state incident photons, as described hereinafter.

Figure 4:
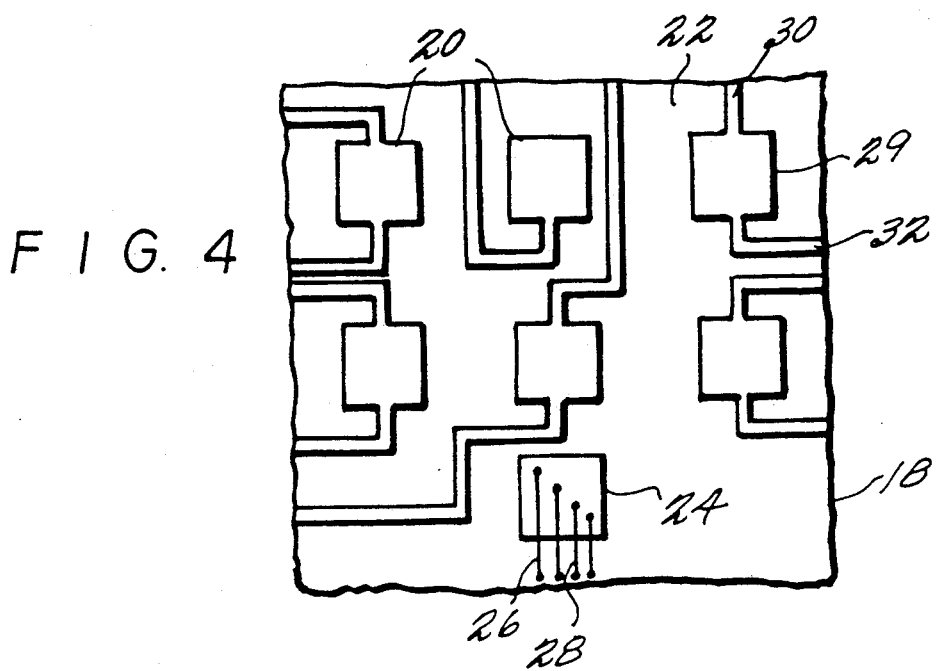
FIG. 4 is a partial top view of a detector chip.

FIG. 4 illustrates a section of detector chip 18. Detector chip 18 is composed of substrate 22 and a plurality of superconducting detectors 20. At least one superconducting detector 20 mounted on substrate 22 has a four point probe connected to the back surface of superconducting detector 20. A four point probe is shown as attached to detector 24 in FIG. 4. Outside wires 26 have their opposite ends each connected to a constant current source. Inside wires 28 are then connected to a potentiometer (not shown) which measures the voltage across the inner wires. The resistivity of the superconducting detector 20 can be very accurately determined using a four point probe.

Most of the superconducting detectors 20 on detector chip 18 are sensed using a two point probe. Detector 29, having a two point probe, is illustrated in FIG. 4 with wire pairs 30 and 32 attached at two points. One wire from each pair is then connected to a current source and the other wire from each pair is connected to a potentiometer. The voltage is then measured across the two points. Because the voltage is measured across the same points as the current is driven, this type of detector is not as accurate as detector 24 which uses the four point probe previously described. However, generally for detecting photons, it is accurate enough to make the required measurements.

FIG. 3 illustrates one embodiment of an apparatus for detecting photons using a superconducting material. The housing 34 houses most of the structure. Detector chip 18, which includes a plurality of superconducting detectors 20 mounted on substrate 22, are attached to housing 34 with brackets 36. Detector chip 18 is mounted in a chamber 38 which can be filled with liquid nitrogen.

When chamber 38 is filled with liquid nitrogen, it brings the temperature of superconducting detectors 20 to 77° K. After superconducting detectors 20 reach a temperature of 77° K., the liquid nitrogen within chamber 38 is allowed to evaporate. Liquid nitrogen in chambers 40 is kept in these chambers 40 throughout operation of the superconducting broadband detector. After the liquid nitrogen in chamber 38 is removed, the liquid nitrogen in chambers 40 maintains the temperature of superconducting detectors 20 at about 77° K.

Infrared illuminators 42 are used to increase the temperature of the superconducting detectors 20 to the temperature of the working point (shown for YBa$_2$Cu$_3$O$_7$ as working point 12 in FIG. 1) and stabilize the temperature at the working point.

Infrared illuminators 42 are copper cylinders which hold a calcium fluoride lens and which are directed at detector chip 18. Moving infrared illuminators 42 toward or away from detector chip 18 decreases or increases, respectively, the effective field of view which irradiates detector chip 18. Infrared illuminators 42 are moved by servo motors 44 controlled by conventional feedback circuit 46. Feedback circuit 46 receives a very accurate resistance measurement from the four point probe on a detector such as detector 24 illustrated in FIG. 4. This measurement is used by feedback circuit 46 to determine whether infrared illuminators 42 should be moved toward or away from detector chip 18. When the correct working point is reached, infrared illuminators 42 are then in their correct position and servo motors 42 and feedback circuit 46 are turned off.

The illumination from infrared illuminators 42 counteract the cooling effect of the liquid nitrogen in chambers 40 to keep the detector chip 18 in a temperature equilibrium at the working point. Therefore, photons which strike the superconducting detectors 20 on detector chip 18 after the working point is established will be the only cause of a temperature increase in superconducting detectors 20.

To establish an accurate working point, shutter 50 is placed over window 52. Window 52 allows incident light 48 to strike detector chip 18 when the broadband superconducting detector is operating. When the broadband superconducting detector is ready for use, shutter 50 is removed from window 52 and incident light 48 travels through window 52 and strikes detector chip 18. Window 52 is constructed using two window panes which form a vacuum 54 between them so that condensation does not develop on the window 52 due to the low temperature of the liquid nitrogen contained within housing 34.

As photons of incident light 48 strike superconducting detectors 20, the temperature rises and resistance of superconducting detectors 20 correspondingly increases. This increase in resistance is detected by two point probes illustrated on superconducting detectors 20 such as detector 24 of FIG. 4. The measured voltage and known current values are then sent to computation circuit 56 to determine the resistivity of superconducting detectors 20. Once the resistivity of superconducting detectors 20 is determined, the presence of incident photons can also be determined by computation circuit 56.

Once a certain number of photons have been detected, superconducting detectors 20 will be at a temperature which is greater than the working point. Therefore, in order to use the device again, the temperature of superconducting detectors 20 must be brought back down to the working point. This can be done by refilling chamber 38 and determining the working point once again as earlier described. However, if the wavelength of the photons detected by the superconducting detectors 20 have a wavelength less than the thickness of the detector chip, the liquid nitrogen in chambers 40 will quickly cool down the superconducting detectors 20 to the working point because of blackbody radiation.

FIG. 5 illustrates an embodiment of the invention that substitutes a detector 70 for the detector chip 18 described in the previous embodiments. Detector 70 includes at least one detector element 72, but can include an array of detector elements 72, such as a 256×256 array of individual detector elements 72, constructed as further described below. FIG. 5 illustrates two detectors 72, with the detector on the left side being an end view of and the detector on the right side being a side view.

Each detector element 70 contains a miniature sphere 72, also termed microsphere, which can be made of glass or appropriate plastic, and can also be found in naturally occurring flyash. Each miniature sphere 72 contains a hollow center and has a diameter that is typically at least twice as great as the longest wavelength of incident radiation to be detected, although smaller diameters may also perform adequately. A sphere is used because it is mechanically the best configuration to obtain a large surface area and a thin mass. The sphere 72 serves the same purpose as substrate 22 shown in FIG. 2.

Each sphere 72 is then coated with a strip 74 of superconducting detector material, which is the same material used to make each superconducting detector 20 illustrated in FIGS. 2A and 2B and previously described. The thickness of the superconducting detector 20 material can vary, but does not need to be thicker than an amount equal to the longest wavelength of incident radiation to be detected. The strip 74 extends from one side 76 of a base 78 of sphere 72 to an opposite side 80 of base 78 over the outermost circumference of the sphere 72.

The base 78 is attached to a circuit board 82. A conductive epoxy having a low heat conduction coefficient (not shown) establishes electrical contact between each side of strip 74 and the conductive surfaces 84 and 86. A non-conductive epoxy also having a low heat conduction coefficient is used to attach the other portions of base 78 to circuit board 82. This construction, especially with the base 78 having a small surface area contacting circuit board 82, discourages thermal heat conduction from the sphere 72 to the circuit board 82. Thus, circuit board 82 will not contribute in any large measure as a heat sink.

The resistance between conductive surfaces 84 and 86 can be measured, with strip 74 providing a resistive path, using a two point probe as previously described with reference to FIGS. 3 and 4, with conductive surfaces 84 and 86 being the points of the two point probe.

In operation, many different factors contribute to establishing the equilibrium temperature. If only one sphere 72 is used, that sphere 72 will emit blackbody radiation in all directions. This blackbody radiation will be absorbed by the walls of chambers 40, which are at a temperature lower than the equilibrium temperature, and by circuit board 82, which is kept at the equilibrium temperature to minimize thermal conduction with sphere 72 so that it will not contribute as a heat sink as described above. Furthermore, infrared illuminators as previously described with reference to FIG. 3, for example, are used to heat the sphere 72, along with strip 74 of superconducting material, to counter the temperature lowering effect of chamber 40 and establish the equilibrium temperature.

Once the equilibrium temperature is established, incident radiation falling on strip 74 will cause an increase in its temperature. This increase in temperature will continue as long as radiation is incident. Once the radiation stops, strip 74 will cool and return to the equilibrium temperature. Thus, a steady state flux of photons can be detected due to the change in resistance of strip 74 when photons are incident.

If two or more spheres 72 are used to detect incident radiation, each sphere should preferably be surrounded by cool divider walls, such as the cool divider wall 88 illustrated in FIG. 5. Cool divider walls are preferably made of metal and kept at the equilibrium temperature. This makes it easier to control the temperature of individual spheres.

While the invention has been described in connection with what is presently considered to be most practical and preferred embodiments, it is to be understood that the invention is not limited to the disclosed embodiment but is intended to cover various modifications and equivalent arrangements included within the spirit and scope of the appended claims. For example, other means can be used to keep the superconducting detectors 20 at the working point 12 indicated in FIG. 1. Also, the working point 12 indicated on FIG. 1 will vary with the different superconducting material being used to make the broadband superconducting detector. Therefore, persons of ordinary skill in this field are to understand that all such equivalent structures are to be included within the scope of the following claims.

What is claimed is:

1. A broadband photon detector comprising:
   a housing;
   a superconducting material such that at least within a given temperature range incident photons increase the temperature of said material and the resistivity of said material varies in accordance with the temperature of said material;
   a substrate on which said material is mounted, said substrate and said material further being disposed within said housing and said substrate comprising at least one microsphere having a hollow center;
   means for establishing said material at a given temperature within said range using blackbody radiation disposed in said housing;
   means for orienting said material so that photons can fall on said superconducting material; and
   means for sensing an increase in the resistivity of said material.

2. A detector according to claim 1, wherein said microsphere is made of one of glass, plastic, and flyash.

3. A detector according to claim 1 wherein said microsphere includes a base that is mounted on a circuit board and said superconducting material is mounted on said microsphere as a strip coating extending from one side of said base and over the circumference of said microsphere to an opposite side of said base.

4. A detector according to claim 3 wherein said superconducting material strip has a thickness equal to the longest wavelength of incident radiation to be detected.

5. A detector according to claim 1 wherein said microsphere has a diameter of at least twice the longest wavelength of incident radiation to be detected.

6. A detector to be used for sensing incident broadband radiation and attached to a circuit board located in a housing at which an equilibrium temperature can be established comprising:
   a superconducting material such that at least within a given temperature range incident photons increase the temperature of said material and the resistivity of said material varies in accordance with the temperature of said material; and
   hollow spherical means for supporting said superconducting material without substantially causing thermal conduction away from said superconducting material.

7. A detector according to claim 6 wherein said hollow spherical means is a microsphere made of one of glass, plastic, and flyash.

8. A detector according to claim 7 wherein said microsphere includes a base that is mounted on said circuit board and said superconducting material is formed as a strip extending from one side of said base and over the circumference of said microsphere to an opposite side of said base.

9. A detector according to claim 7 wherein said microsphere has a diameter of at least twice the longest wavelength of incident radiation to be detected.

10. A detector according to claim 6 wherein said superconducting material has a thickness equal to the longest wavelength of incident radiation to be detected.

11. A detector to be used for sensing incident broadband radiation and attached to a circuit board located in a housing at which an equilibrium temperature can be established comprising:
a superconducting material such that at least within a given temperature range incident photons increase the temperature of said material and the resistivity of said material varies in accordance with the temperature of said material; and
means for supporting said superconducting material without substantially causing thermal conduction away from said superconducting material, said supporting means comprising a plurality of hollow microspheres.

12. A detector according to claim 11 further including cooler divider walls separating each of said plurality of hollow microspheres.

13. A detector according to claim 11 wherein each of said hollow microspheres is made of one of glass, plastic, and flyash.

14. A detector according to claim 11 wherein each of said hollow microspheres includes a base that is mounted on said circuit board and said superconducting material is formed as a strip on each of said microspheres, extending from one side of said base and over the circumference of said microsphere to an opposite side of said base.

15. A detector according to claim 11 wherein said superconducting material has a thickness equal to the longest wavelength of incident radiation to be detected.

16. A detector according to claim 11 wherein said microsphere has a diameter of at least twice the longest wavelength of incident radiation to be detected.

* * * * *